US005289137A

United States Patent [19]

Nodar et al.

[11] Patent Number: 5,289,137

[45] Date of Patent: Feb. 22, 1994

[54] SINGLE SUPPLY OPERATIONAL AMPLIFIER AND CHARGE PUMP DEVICE

[75] Inventors: Joseph Nodar, Dallas; Todd M. Neale, Carrollton, both of Tex.; Douglas R. Johnson, Cedar Rapids, Iowa

[73] Assignee: Texas Instruments Incorporated, Dallas, Tex.

[21] Appl. No.: 67,404

[22] Filed: May 25, 1993

Related U.S. Application Data

[63] Continuation of Ser. No. 815,455, Dec. 31, 1991, abandoned.

[51] Int. Cl.[5] .............. H03F 3/04

[52] U.S. Cl. .............. 330/296; 330/297

[58] Field of Search .............. 330/252, 253, 261, 300, 330/301, 258, 296, 297; 307/296.1

[56] References Cited

U.S. PATENT DOCUMENTS 4,780,625 10/1988 Zobel .............. 330/258 X

*Primary Examiner*—Steven Mottola

*Attorney, Agent, or Firm*—Wade James Brady, III; Richard L. Donaldson

[57] ABSTRACT

An integrated circuit device (10) has an operational amplifier (12) and a charge pump (14) for creating a negative voltage level −Vcc. The operational amplifier (12) preferably has various sub-components. In particular, a bias generator (36) is included and connected to a neutral voltage level (31) isolated from the negative voltage level and providing current for operational amplifier (12). An input stage (38) has inputs (16 and 18) for receiving two input signals and maintains the input signals in a balanced signal path. A conversion circuitry (40) receives the input signals and creates a single differential signal eliminating noise received in the input stage (38). An output stage prepares this single differential signal for transfer out of the operational amplifier (12).

24 Claims, 5 Drawing Sheets

SINGLE SUPPLY OPERATIONAL AMPLIFIER AND CHARGE PUMP DEVICE

This application is a continuation of application Ser. No. 07/815,455, filed Dec. 31, 1991, now abandoned.

TECHNICAL FIELD OF THE INVENTION

This invention relates in general to integrated circuit devices and more particularly to a single supply operational amplifier coupled with a charge pump in a single device.

BACKGROUND OF THE INVENTION

Operational amplifiers and charge pumps are well known in the prior art. An operational amplifier is used to perform a wide variety of linear and digital functions. A charge pump is used to create a negative voltage level from a positive voltage level. Thus, one common technique is to use a charge pump in combination with an operational amplifier, thereby allowing a user to provide only a single supply signal. Through this combination, the single supply signal, when transformed via the charge pump, provides both a positive and a negative supply to the operational amplifier. The charge pump and the operational amplifier, however, are found in separate packages and thus require the user to couple them together for implementation.

In addition to the above, when implementing an operational amplifier with a charge pump, a problem occurs from a ripple effect inherent in the negative voltage level created in the charge pump. The ripple effect is created by an oscillator within the charge pump, causing voltage spikes to appear on the negative voltage level. Prior art operational amplifiers have limited capability to avoid this ripple effect. Thus, this ripple effect is often introduced into the operational amplifier circuitry, decreasing the performance capabilities of the circuit.

Another goal often required by the user of an operational amplifier is to provide an output of zero volts since this is a known reference voltage. However, prior art single supply operational amplifiers can only provide an output within one to two diode voltages of zero volts. Many techniques have been used to create this zero volt output of the operational amplifier, but these techniques often degrade other circuit characteristics. For example, by using bipolar circuitry, a zero volt output can be obtained by sacrificing linearity and low distortion at the output of the operational amplifier. The resultant high distortion and nonlinearity may cause inaccuracies throughout an implemented system. As another example, CMOS technology can produce a zero volt output, but sacrifices high output current and low output impedance from the operational amplifier. These sacrifices are often undesirable because many applications require high output current to drive highly capacitive loads. Thus, prior art single supply operational amplifiers cannot provide a zero volt output without affecting other circuit characteristics.

From the foregoing, it may be appreciated that a need has arisen for an operational amplifier able to provide a zero volt output without sacrificing linearity, low distortion, high output current, or low output impedance. A need has also arisen to combine a charge pump and an operational amplifier into a single device and isolate the ripple effect of the negative voltage level created in the charge pump from the operational amplifier.

SUMMARY OF THE INVENTION

In accordance with the present invention, an operational amplifier and a single charge pump/operational amplifier device are provided which substantially eliminate or reduce disadvantages and problems associated with prior operational amplifiers and charge pumps.

The operational amplifier includes a bias generator coupled to a neutral voltage level for isolating the bias generator from a negative voltage level. The bias generator provides appropriate current levels for the operational amplifier. The operational amplifier has two inputs to receive two input signals. The input signals enter into a balanced signal path of an input stage coupled to the bias generator. The two input signals are converted into a single differential signal before entering an output stage. The output stage prepares the converted differential signal for transfer out of the operational amplifier as an output signal.

The single charge pump/operational amplifier device is an integrated circuit device capable of receiving a first voltage level and a second neutral voltage level. The integrated circuit device includes an operational amplifier and a charge pump. The charge pump creates a third voltage level in response to the first voltage level. The operational amplifier has a bias generator isolated from the third voltage level.

The present invention provides numerous technical advantages over other operational amplifiers and separate charge pump circuits within the prior art. One technical advantage is in obtaining a zero voltage level output from the operational amplifier without sacrificing linearity or low distortion. Another technical advantage is in obtaining a zero voltage level output from the operational amplifier without sacrificing high output current or low output impedance. Yet another technical advantage is in the isolation of the operational amplifier from the ripple effect inherent in the negative voltage level created by the charge pump. Still another technical advantage is in placing an operational amplifier and a charge pump in a single package enabling a user to provide only a single supply voltage to a single chip device, reducing the amount of space and connecting hardware required.

BRIEF DESCRIPTION OF THE DRAWINGS

For a more complete understanding of the present invention and the advantages thereof, reference is now made to the following description taken in conjunction with the accompanying drawings, wherein like reference numerals represent like parts, in which.

FIGS. *5a–5c* are a schematic diagram of the charge pump.

DETAILED DESCRIPTION OF THE INVENTION

Figure 1:
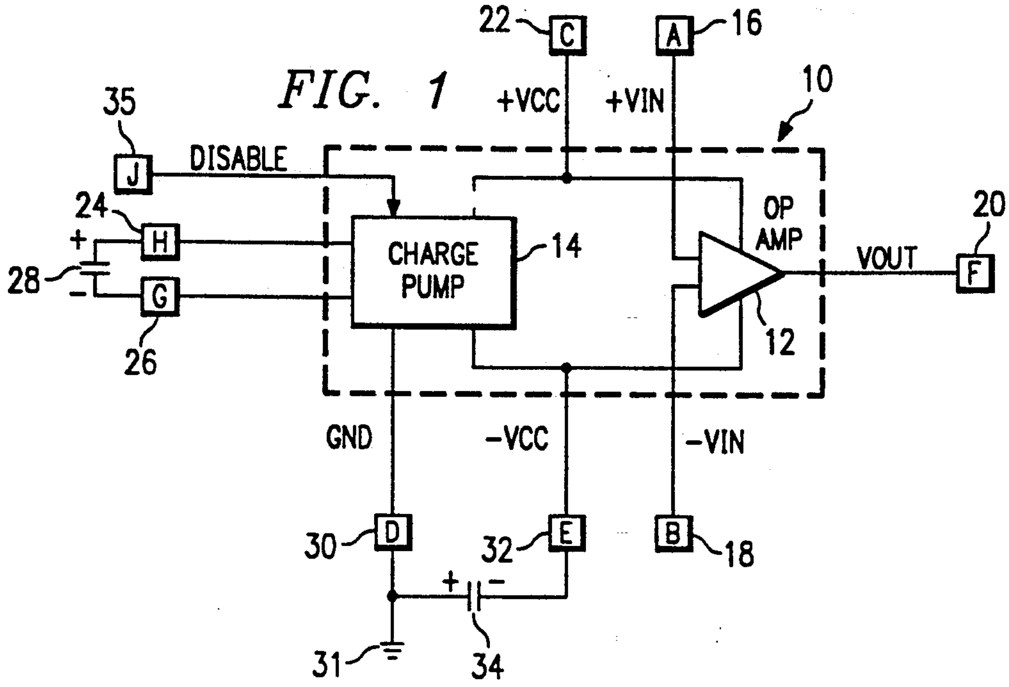
FIG. 1 is a block diagram of a single charge pump/operational amplifier device.

Referring to FIG. 1, there is illustrated a block diagram of a single charge pump/operational amplifier device 10 according to the present invention. Device 10 is comprised of an operational amplifier 12 and a charge pump 14. Device 10 also comprises various external pin connections (illustrated with capital letters) for external signal coupling. Operational amplifier 12 has one input 16 for receiving an input signal +VIN and a second input 18 for receiving an input signal −VIN. An output 20 provides an output signal VOUT from operational amplifier 12. A single supply signal input 22 is operable to provide a positive voltage level, +VCC, to operational amplifier 12 and charge pump 14. Charge pump 14 has pins 24 and 26 for connecting a first external capacitor 28 to device 10. Pin 24 is connected to a cathode of capacitor 28 and pin 26 is connected to an anode of capacitor 28. Charge pump 14 has a pin 30 connected to a neutral voltage level 31, which is typically tied to ground, and a pin 32 which provides a negative voltage level, −VCC, created by charge pump 14. This negative voltage level is used as a power source for operational amplifier 12 and can also be used to power other devices that are connected to pin 32. A second external capacitor 34 is connected across pins 30 and 32 and is used in creating the negative voltage level as discussed in greater detail below. External capacitors 28 and 34 preferably have relatively large values of 1 microfarad and greater. A pin 35 may receive a DISABLE signal to turn off charge pump 14.

In operation, a user provides a single positive voltage level, +VCC, to device 10 which itself generates a negative voltage, −VCC. In particular, this positive supply signal provides power to charge pump 14 and operational amplifier 12. Charge pump 14 creates a negative voltage level, −VCC, to further power operational amplifier 12. External capacitors 28 and 34 are used by charge pump 14 to create the negative supply. Operational amplifier 12 produces an output signal VOUT which may swing from just below the positive voltage level to just above the negative voltage depending on input signals +VIN and −VIN. Output signal VOUT can typically reach a value within 0.2 volts of each voltage level. Thus, a single supply operational amplifier with near positive rail to near negative rail output capability is provided.

Figure 2:
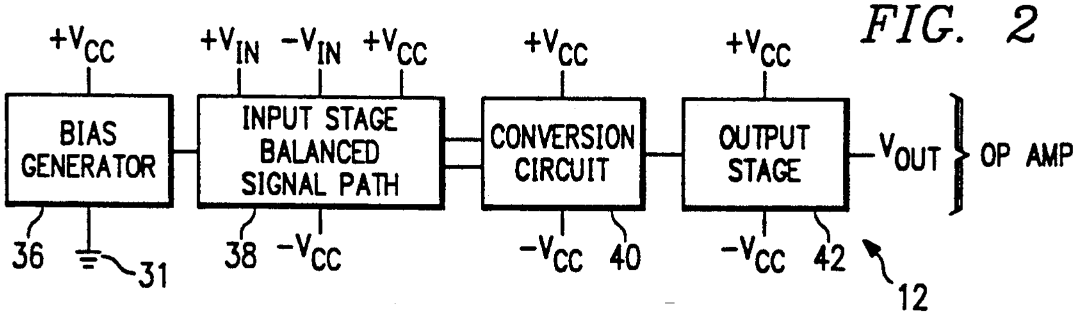
FIG. 2 is a block diagram of the operational amplifier.

FIG. 2 is a block diagram of operational amplifier 12. Operational amplifier 12 comprises a bias generator 36 which is powered between +VCC and neutral voltage level 31. Comparatively, prior art operational amplifiers typically have a bias generator connected between the positive voltage level, +VCC, and the negative voltage level, −VCC. This connection, however, makes the bias generator susceptible to an undesirable ripple effect inherent in the negative voltage level created by a charge pump.

The ripple effect is created in a variety of ways. First, current from the negative supply of an operational amplifier tends to discharge circuitry within the charg pump coupled to the operational amplifier. This discharge causes the charge pump to continually refresh its negative output level, causing an AC signal to be superimposed on the DC charge pump negative voltage level. Second, voltage spiking produced by an oscillator within the charge pump appears on the negative voltage level. These distortions to the negative voltage level of the charge pump tend to feed through to the operational amplifier output with little attenuation. The present invention, by connecting bias generator 36 to neutral voltage level 31 rather than the negative voltage level, isolates bias generator 36 from the negative voltage level. Such isolation avoids the ripple effect of the negative voltage level and prevents it from being introduced into the operational amplifier biasing circuitry.

Bias generator 36 provides DC current and current bias for an input stage 38. Input signals +VIN and −VIN received at inputs 16 and 18 of operational amplifier 12 enter input stage 38 and become placed in a balanced signal path. This signal path remains balanced from inputs 16 and 18 to as close to output 20 as possible to assist in providing further isolation from noise in the input signals. Common noise received at inputs 16 and 18 is reduced or eliminated in the balanced signal path. The bulk of the gain of operational amplifier 12 is created in input stage 38 through this balanced signal path.

The input signals from input stage 38 are coupled to conversion circuitry 40. Conversion circuitry 40 generates a difference between the input signals and creates a single differential signal to be provided to an output stage 42. Output stage 42 receives the single differential signal created by conversion circuitry 40 and processes it for transfer out of operational amplifier 12 at output 20. Depending upon the signals received at inputs 16 and 18, output signal VOUT can have a value anywhere between, but not including, the positive voltage level and the negative voltage level, including the desired zero volt output.

Figure 3:
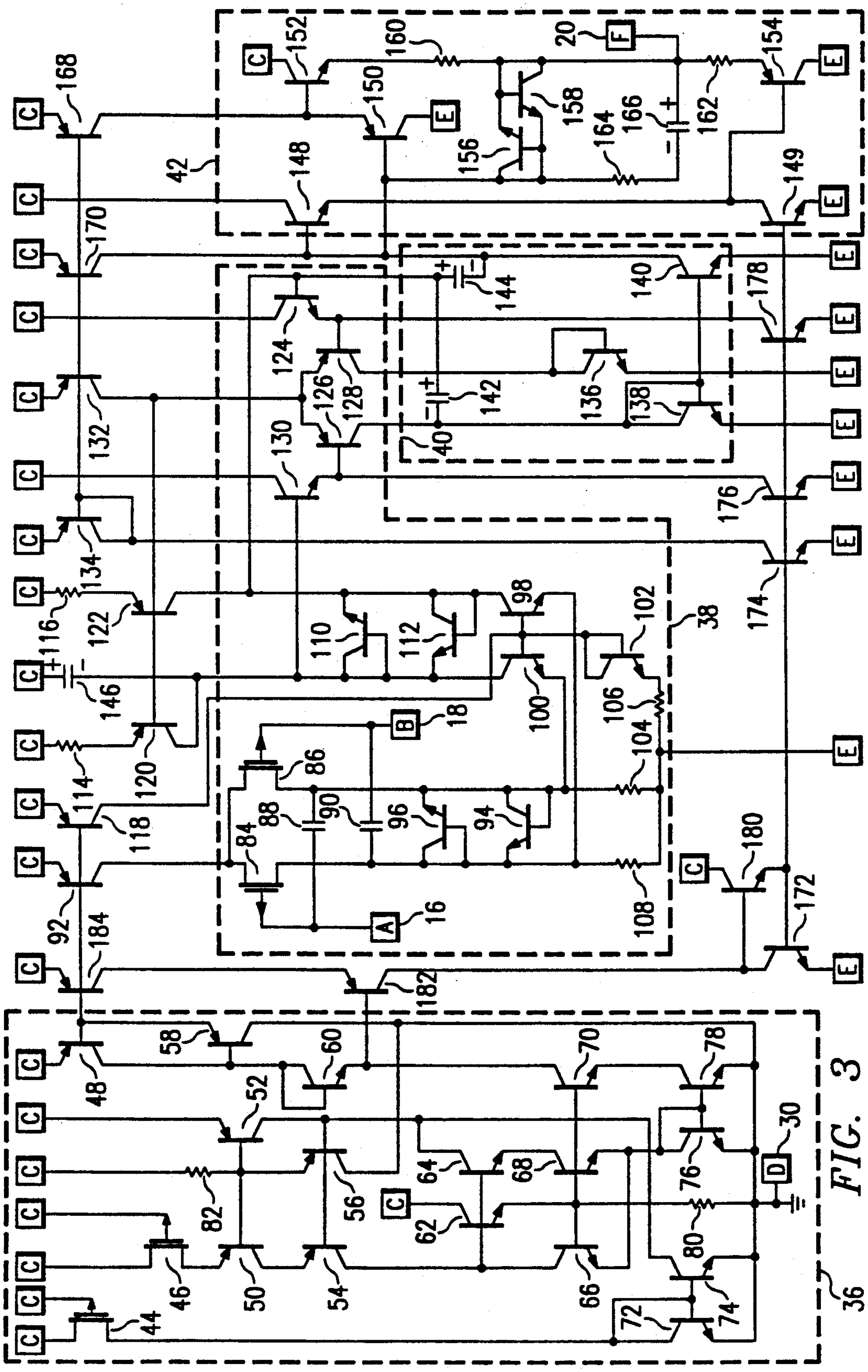
FIG. 3 is a schematic diagram of the operational amplifier.

FIG. 3 illustrates a schematic diagram of operational amplifier 12 featuring bias generator 36, input stage 38, conversion circuitry 40, and output stage 42. Bias generator 36 preferably comprises junction field effect transistors 44 and 46; P-N-P transistors 48, 50, 52, 54, 56, and 58; N-P-N transistors 60, 62, 64, 66, 68, 70, 72, 74, 76, and 78; and resistors 80 and 82. This circuitry for bias generator 36 is connected to a neutral voltage level at pin 30 to isolate the circuit from the negative voltage level, thereby ensuring that the ripple effect does not enter into bias generator 36.

Input stage 38 receives two input signals on inputs 16 and 18 preferably fed into two junction field effect transistors 84 and 86 and two capacitors 88 and 90, respectively. The use of junction field effect transistors at the inputs provides high impedance inputs suitable for interfacing directly to sensors, photo-diodes, and other signal sources typically found in data acquisition systems. Transistor 92 in conjunction with bias generator 36 provides the bias current for transistors 84 and 86. The input signals traverse through the balanced signal path of input stage 38. Transistor clamps 94 and 96 provide voltage limiting between the balanced lines. The balanced signal path provides the bulk of the gain of operational amplifier 12. Most of the gain is created at transistors 98 and 100 which are connected to transistor 102 and resistors 104, 106, and 108. Additional clamping transistors 110 and 112 are used to further limit voltage between the balanced lines. Resistors 114 and 116, and transistors 118, 120, 122 provide bias current for the balanced signal path. Transistors 124, 126, 128, and 130 provide the remainder of the operational amplifier gain when coupled with transistors 138, 140, and 170. Transistor 132 in conjunction with transistor 134 provides bias current for these gain transistors.

The two balanced signals traverse to conversion circuitry 40. Conversion circuitry 40 preferably comprises N-P-N transistors 136, 138, and 140. These transistors convert the two balanced signals into a single differential signal. Compensation capacitors 142, 144, and 146 are included to limit the bandwidth of the circuit. These capacitors are placed in portions of the circuit that are sensitive to noise such as where the gain of the operational amplifier is created and at the balanced signal path to single differential signal conversion.

Once the two balanced signals are converted into a single differential signal, output stage 42 processes the single differential signal for transfer out of operational amplifier 12 at output 20. Output stage 42 comprises transistors 148, 149, 168 and 150 which bias power transistors 152 and 154. Transistors 156 and 158 along with resistors 160 and 162 provide current limiting on output 20 and protect against a short circuit in operational amplifier 12. Resistor 164 and capacitor 166 provide further control of the bandwidth of the circuit. Transistors 168 and 149 provide bias current for output stage 42.

It should be noted that in the preferred embodiment, transistor 154 is a bipolar P-N-P transistor. Previous single supply operational amplifiers could not produce a zero volt output using a bipolar P-N-P transistor. Comparatively, prior art operational amplifiers use a bipolar N-P-N type device for transistor 154 in order to approximate the neutral voltage level. Such a device causes nonlinearity in the gain curve of operational amplifier 12. Additionally, other prior art operational amplifiers implement a CMOS type device which provides zero current for a zero volt output. The present invention is able to use a bipolar P-N-P transistor to produce a zero volt output without affecting the characteristics of the circuit. Thus, output stage 42 of the present invention uses a bipolar P-N-P type device for transistor 154 to provide better linearity and high current at output 20.

The remaining devices in the circuit, transistors 172, 174, 176, 178, 180, 182 and 184 provide further current bias for the foregoing circuitry. To provide further isolation from the ripple effect transistors and capacitors in operational amplifier 12 are preferably fabricated using vertical P-N-P technology. In this technology, the device is fabricated within a semiconductor tank which isolates the device from a semiconductor substrate. Because the negative voltage level ripples within the substrate, the tank of the vertical P-N-P technology isolates the device from the substrate thus negating the ripple effect on components within the circuit. This technology is further described in U.S. Pat. No. 4,439,099 issued Jul. 3, 1990 to Seacrist et al. entitled "Process for Fabricating Isolated Vertical Bipolar and JFET Transistors" incorporated by reference herein.

Figure 4:
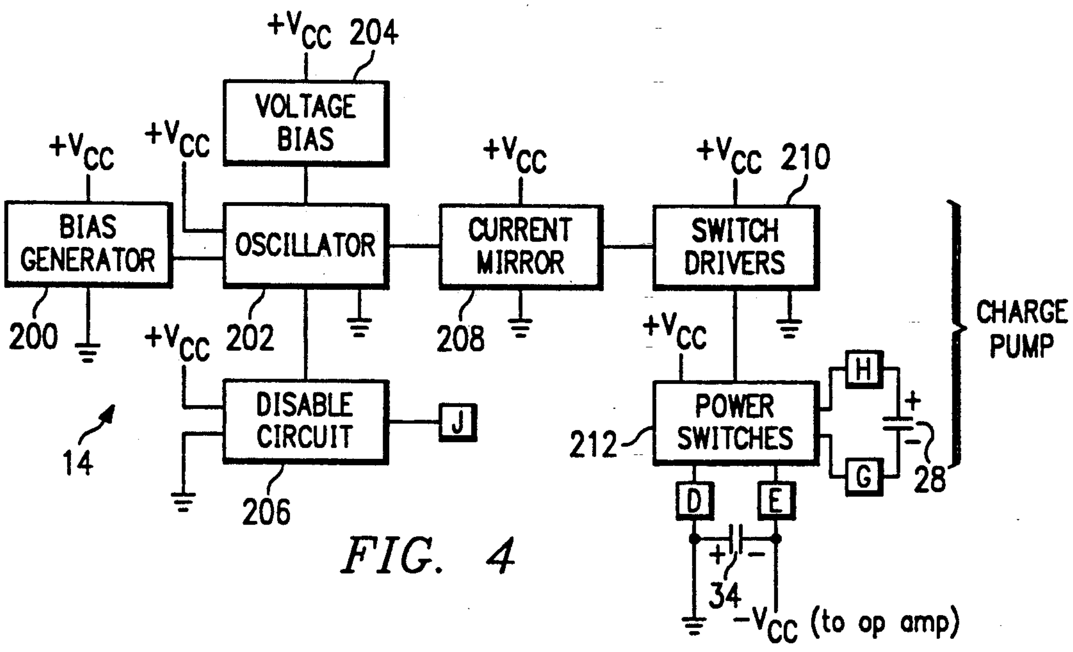
FIG. 4 is a block diagram of the charge pump.

FIG. 4 illustrates a block diagram of charge pump 14. Charge pump 14 comprises a bias generator 200 which provides DC current for charge pump 14. An oscillator 202 provides square wave current signals used to drive power switches 212 which charge and discharge external capacitors 28 and 34, thus providing the negative voltage level. Oscillator 202 has a separate voltage bias generator 204 which reduces any noise existing on the positive voltage level from entering oscillator 202. A disable circuit 206 is provided to enhance the user's capability with other signal processing applications, such as microprocessor based system implementation, and provides further capability to eliminate the ripple effect. Current mirrors 208 are used to isolate oscillator 202 from switch driver 210. The square wave current signals created by oscillator 202 feed through current mirror 208 into switch driver 210. Switch driver 210 turns power switches 212 on and off to charge and discharge external capacitors 28 and 34, thereby creating the negative voltage level at the anode of external capacitor 34.

Figure 5A:
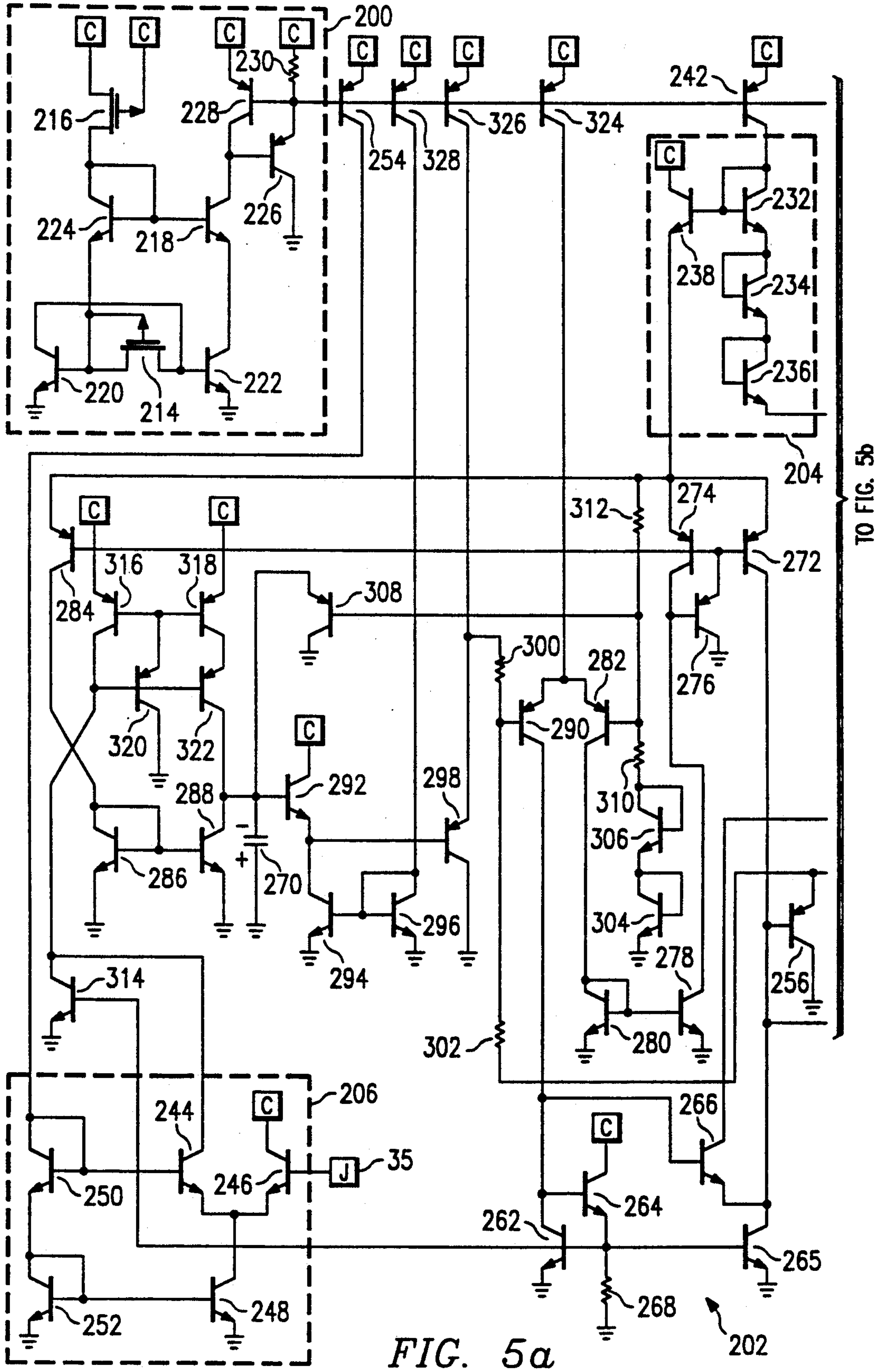
Figure 5B:
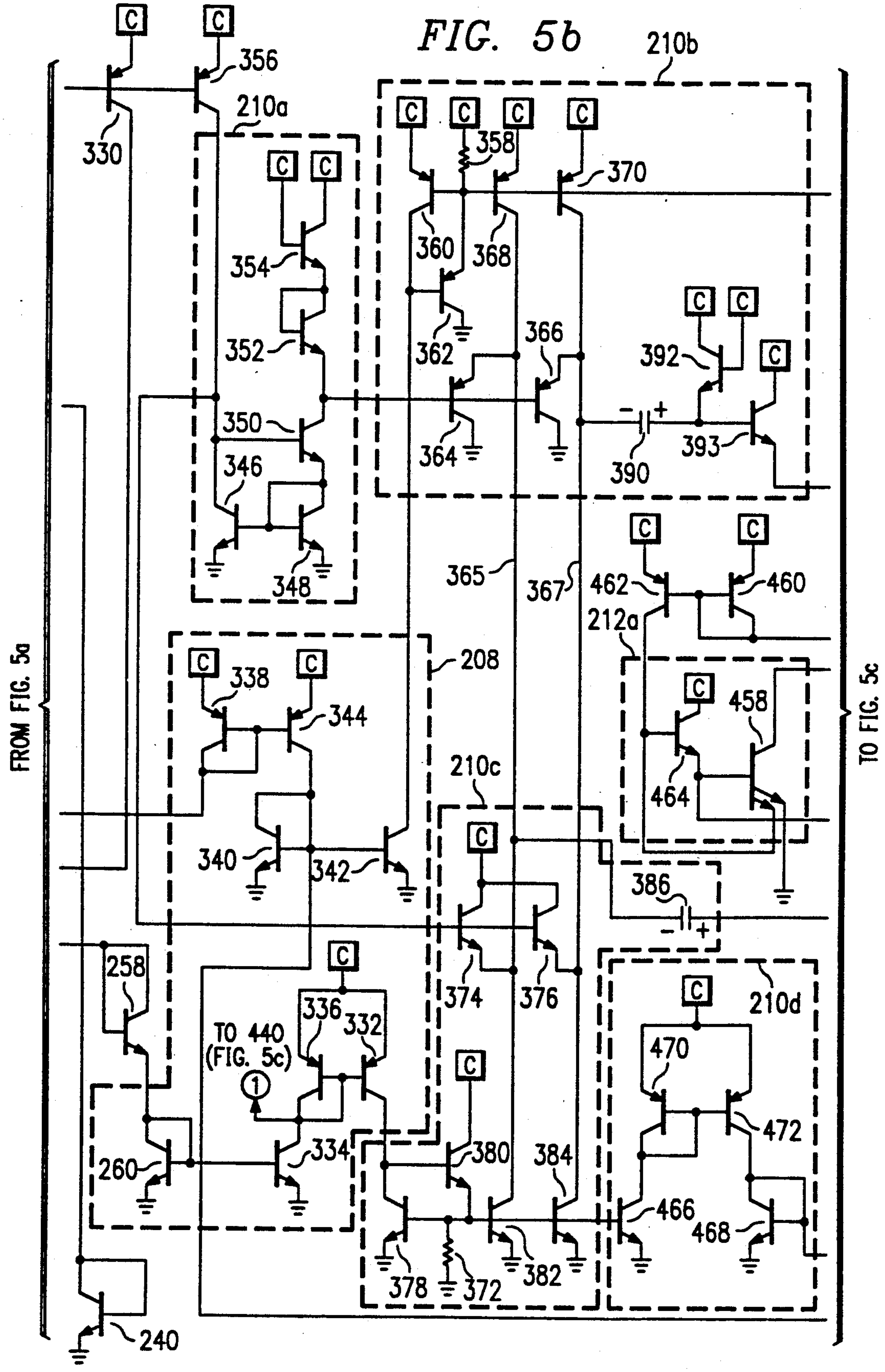
Figure 5C:
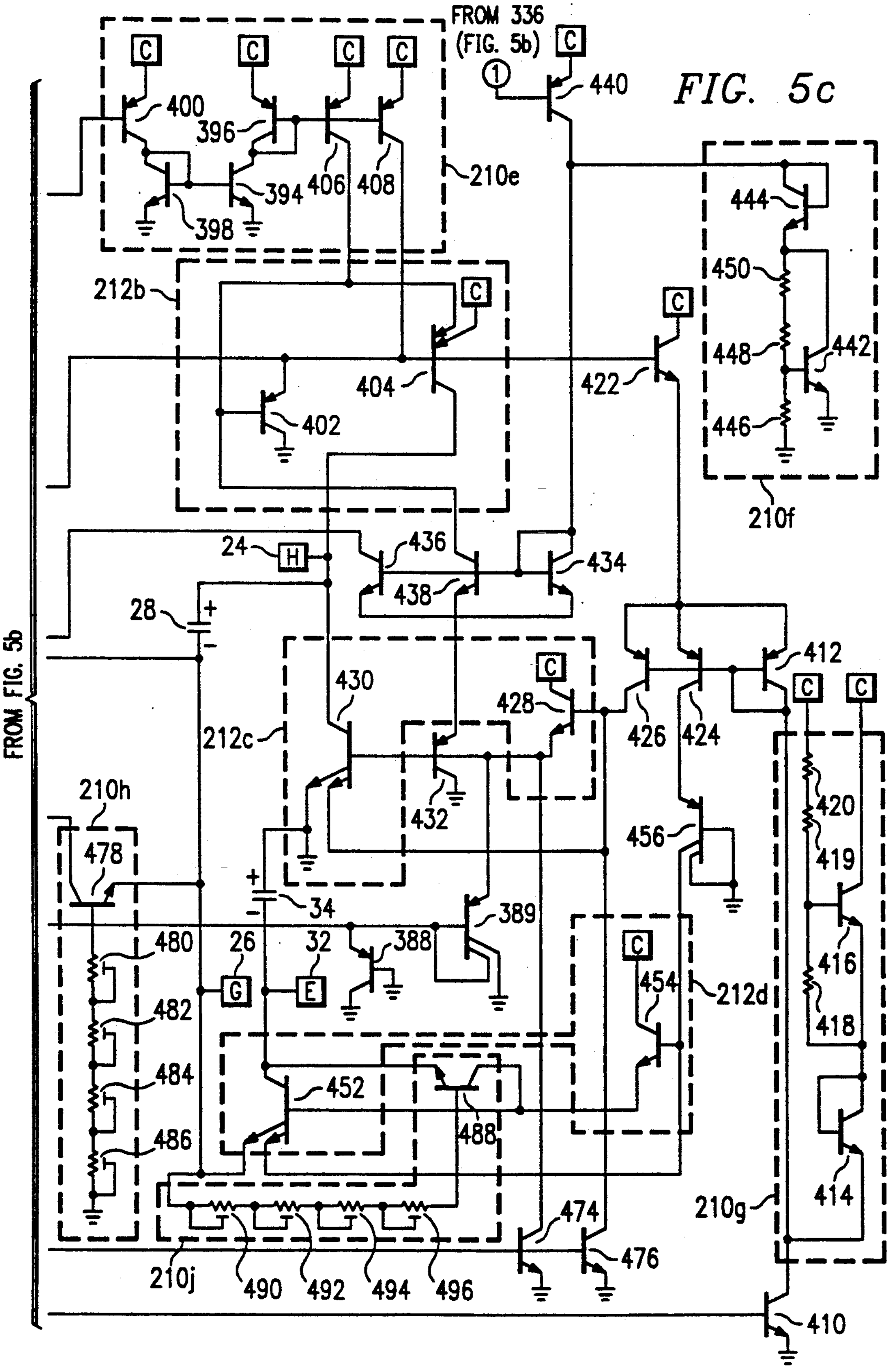

FIGS. 5a–5c illustrate a schematic diagram of charge pump 14. FIG. 5a illustrates the schematic for bias generator 200, oscillator 202, voltage bias generator 204, and disable circuit 206. FIG. 5b illustrates the schematic for current mirror 208, part of switch driver 210 represented by blocks 210a–d, and one of the four power switches represented by block 212a. FIG. 5c illustrates the schematic for the remainder of switch driver 210 represented by blocks 210e–g and three power switches represented by blocks 212b–d.

Referring first to FIG. 5a, bias generator 200 preferably comprises junction field effect transistors 214 and 216; N-P-N transistors 218, 220, 222, and 224; P-N-P transistors 226 and 228; and resistor 230.

Voltage bias generator 204 preferably comprises transistors 232, 234, 236, 238, and transistor 240 (FIG. 5b). These transistors provide a voltage bias of 3 $V_{be}$ to oscillator 202. Voltage bias generator 204 is provided as a safety precaution to ensure that noise on the positive voltage level does not enter into oscillator 202 circuitry. Transistor 242 in conjunction with bias generator 200 provides the bias current for voltage bias generator 204.

Disable circuit 206 comprises transistors 244, 246, 248, 250, and 252. Transistor 254 in conjunction with bias generator 200 provides the bias current for disable circuit 206. Transistors 250 and 252 provide current to activate transistors 244 and 248, respectively. A high state on disable pin 35 causes the current of transistor 248 to go through transistor 246 thus leaving transistor 244 off. In this state, oscillator 202 is free running. When a low state at disable pin 35 occurs, transistor 246 is off and the current from transistor 248 goes through transistor 244 turning transistor 244 on. In this state, oscillator 202 is turned off and power switches 212 are set such that external capacitor 34 starts to slowly discharge. The negative voltage level will start to lose its negative value as external capacitor 34 begins to discharge. During this action, a brief period of time is available to capture a clean signal free of distortion, noise, and ripple. Thus, disable circuit 206 provides another method for eliminating the ripple effect produced by oscillator 202. Proper application of disable circuit 206 allows the user to maximize signal processing accuracy.

Oscillator 202 provides square wave current signals which drive power switches 212. Power switches 212 charge and discharge external capacitors 28 and 34 to create the negative voltage level. A square wave voltage output occurs at the emitter of transistor 256. The square wave voltage output alternates between a high level of 3 $V_{be}$ and low level of 2 $V_{be}$. This is because the voltage at the base of transistor 256 is limited to a high level of 2 $V_{be}$ and a low level of 1 $V_{be}$ In particular, transistors 258 and 260 (FIG. 5b) clamp the voltage at the base of transistor 256 to its high level of 2 $V_{be}$; and transistors 262, 264, 266, and resistor 268 clamp the voltage at the base of transistor 256 to its low level of 1 $V_{be}$. These clamping transistors turn on and off to provide the square wave voltage signal at the emitter of transistor 256.

Capacitor 270 charges and discharges to drive the clamping transistors to an on and off state. When the square wave output at the emitter of transistor 256 is at its high level of 3 $V_{be}$, transistors 272, 274, 276, 278, 280, 282, 284, 286, and 288 are on, causing capacitor 270 to discharge. When the voltage at the anode of capacitor 270 drops down to 2 $V_{be}$ , the voltage at the base of transistor 290 will equal 2.5 $V_{be}$ in response to transistors 292, 294, 296, and 298 and resistors 300 and 302. Clamping transistors 304, 306, and 308 and resistors 310 and 312 assist in switching oscillator 202 from one state to another. The comparator circuit of transistors 282 and 290 will switch states causing transistor 290 to turn on and transistor 282 to turn off. Transistors 262, 264, 265, 314, 316, 318, 320, and 322 turn on causing capacitor 270 to charge. Once the voltage at the anode of capacitor 270 reaches 3 $V_{be}$, the comparator circuit switches back to the discharging state. This process repeats indefinitely. Transistors 324, 326, and 328 and transistor 10 (FIG. 5*b*) in conjunction with bias generator 200 provide bias current for oscillator 202.

When the square wave voltage output is in its high 3 $V_{be}$ state, current is being switched into transistor 258 (FIG. 5*b*) and no current is switched into transistor 266. When the square wave voltage output is in its low 2 $V_{be}$ state, no current is switched into transistor 258 (FIG. 5*b*), but current is switched into transistor 266. Referring now to FIG. 5*b*, the collector current of transistor 258 passes through one part of current mirror 208 comprising transistors 260, 332, 334, and 336. The collector current of transistor 332 will be equal to the collector current of transistor 258. Similarly, the collector current of transistor 266 (FIG. 5*a*) passes through the other part of current mirror 208 comprising transistors 338, 340, 342, and 344. The collector current of transistor 342 will be equal to the collector current of transistor 266. Current mirror 208 isolates oscillator 202 from switch driver 210. The collector currents of transistors 332 and 342 are used to activate switch driver 210.

Switch driver 210 has its own internal voltage bias generator 210*a* comprising transistors 346, 348, 350, 352, and 354. Transistor 356 in conjunction with bias generator 200 provides bias current for these transistors. Internal voltage bias generator 210*a* provides biasing for clamping transistors 364 and 366 in upper reverse bias circuit 210*b*. Internal voltage bias generator 210*a* also provides biasing for clamping transistors 374 and 376 in lower reverse bias circuit 210*c*. Reverse bias circuits 210*b* and 210*c* ensure that power switch 212*b* (FIG. 5*c*) and power switch 212*c* (FIG. 5*c*) turn off when required. Power switch 212*a* and power switch 212*d* (FIG. 5*c*) do not need such circuitry because they are reverse biased by the negative voltage level.

Transistors 364 and 366 of bias circuit 210*b* clamp lines 365 and 367, which are connected to their respective emitters, to $+V_{cc}-V_{be}$. When there is current at the collector of transistor 342 of current mirror 208, transistors 360, 362, 368, and 370 coupled to resistor 358 of upper reverse bias circuit 210*b* turn on, and lines 365 and 367 become clamped to $+V_{cc}-V_{be}$. When oscillator 202 changes states, current flows at the collector of transistor 332 turning on transistors 378, 380, 382, and 384 coupled to resistor 372 of lower reverse bias circuit 210*c* causing lines 365 and 367 to swing down to $+V_{be}$. The cathode of capacitor 386 is clamped by transistors 388 and 389 (FIG. 5*c*) to swing from $+V_{be}$ to $-V_{be}$. The cathode of capacitor 390 is clamped by transistors 392 and 393 to swing from $+V_{cc}-V_{be}$ to $+V_{cc}+V_{be}$.

Referring now to FIG. 5*c*, when current flows at the collector of transistor 342 (FIG. 5*b*), transistors 394, 396, 398, 400, 406, and 408 of base current circuit 210*e* turn on causing transistor 404 to begin to turn off by limiting the base current to transistor 402 of power switch 212*b*. When the voltage across transistor 404 shrinks to half its on value, current from transistor 410 flows to transistor 412 and not through a voltage clamp 210*g* comprising transistors 414 and 416 and resistors 418, 419, and 420. The change in voltage level across transistors 404, 422, and 412 causes current from transistor 410 to flow to transistor 412, causing transistors 412, 424, and 426 to turn on. Transistor 428 turns on activating power switch transistor 430 of power switch 212*c*. Transistors 432, 434, 436, and 438 turn off, causing current from transistor 440 to flow down voltage clamp 210*f* comprising transistors 442 and 444 and resistors 446, 448, and 450. Transistor 402 also turns off thus providing further shut down to power switch transistor 404 in power switch 212*b*. Power switch transistor 452 of power switch 212*d* is turned on through transistors 454 and 456. With power switches 452 and 430 turned on, external capacitor 34 begins to charge. Power switch transistor 458 of power switch 212*a* (FIG. 5*b*) is turned off from transistor 436 through transistors 460 and 462, and transistor 464 of power switch 212*a* (FIG. 5*b*). Accordingly, external capacitor 28 starts discharging since power switch transistors 404 and 458 (FIG. 5*b*) are off.

When current flows at the collector of transistor 332 (FIG. 5*b*) after oscillator 202 changes states, power switch transistors 458 (FIG. 5*b*) and 404 turn on while power switch transistors 430 and 452 turn off. Collector current at transistor 332 causes base current circuit 210*d* (FIG. 5*b*), comprising transistors 466, 468, 470, and 472 (FIG. 5*b*) and transistors 474 and 476, to turn on. Base current circuits 210*d* (FIG. 5*b*) and 210*e* ensure that power switches 212*b* and 212*c* are not on simultaneously to prevent a short across the positive voltage level. Transistors 474 and 476 turn on and begin deactivation of power switch transistor 430. Transistors 432, 434, 436, and 438 turn on feeding power switch 212*b* to activate power switch transistor 404. Transistors 460 and 462, and transistor 464 (FIG. 5*b*) of power switch 212*a* also turn on to activate power switch transistor 458. Current from transistor 410 will now flow in voltage clamp 210*g* at transistor 414 causing transistors 412, 424, 426, and 456 to turn off. These in turn shut off transistors 428 and 454 deactivating power switch transistors 430 and 452.

Protection circuit 210*h* comprising transistor 478 and resistors 480, 482, 484, and 486 prevent power switch transistor 458 (FIG. 5*b*) from breaking down. Similarly, protection circuit 210*j* comprising transistor 488 and resistors 490, 492, 494, and 496 prevent power switch transistor 452 from breaking down. Switch driver 210 also ensures that power switch transistors 458 (FIG. 5*b*) and 404 turn off before power switch transistors 430 and 452 turn on and vice versa. Power switch transistors 458 (FIG. 5*b*), 404, 430, and 452 preferably have a double emitter configuration. The second emitter creates a negative feedback loop preventing strong saturation in the transistors. Such prevention makes the power switch transistors switch more efficiently than single emitter transistors.

Thus, it is apparent that there has been provided in accordance with the present invention, an operational amplifier and a single charge pump/operational amplifier device that satisfies the objects, aims, and advantages set forth above. Although the preferred embodiment has been described in detail, it should be understood that various changes, substitutions, and alterations can be made herein. For example, though operational amplifier 12 is shown in conjunction with a charge pump 14 in FIG. 1, operational amplifier 12 can be fabricated as a separate device in order to utilize its isolation characteristics in other applications. As another example, many components have been illustrated as directly connected to one another. Yet it should be understood that such components could in many instances be coupled together via an intermediate component rather than being directly connected to one another. Other examples are readily ascertainable by one skilled in the art and could be made without departing from the spirit and scope of the present invention as defined by the following claims.

What is claimed is:

1. An operation amplifier comprising:

a bias generator operable to couple to a neutral voltage level providing current bias said neutral voltage level being between a positive voltage level and a negative level, said bias generator being isolated from the negative voltage level;

an input stage coupled to said bias generator and operable to receive two input signals, said input stage comprising a balanced signal path to isolate noise found on said input signals;

a conversion circuit coupled to said balanced signal path for converting said input signals into a single differential signal; and an output stage coupled to said conversion circuit for processing sad single differential signal into an output signal, said output signal operable to swing from substantially near the positive voltage level to substantially near the negative voltage level in response to a variation of said input signals;

wherein said output stage comprises a P-N-P type transistor to provide linearity and low distortion on said output signal.

2. The operational amplifier of claim 1 wherein said P-N-P transistor is coupled to said output signal.

3. The operational amplifier of claim 2 wherein an emitter of said P-N-P transistor is coupled to said output signal.

4. The operational amplifier of claim 3 wherein a resistor is coupled between said emitter and said output signal.

5. The operation amplifier of claim 1 wherein the operational amplifier is formed in a substrate and further comprising transistor device fabricated in a semiconductor tank within said substrate said tank isolating said transistor devices from said substrate and from the negative voltage level.

6. The operational amplifier of claim 1 wherein said input stage comprises junction field effect transistors for receiving said input signals.

7. The operational amplifier of claim 1 wherein said output signal (12) is operable to drive highly capacitive loads.

8. An operational amplifier operable to receive a positive voltage level, a neutral voltage level, and a negative voltage level, comprising:

a bias generator operable to couple between the positive voltage level and the neutral voltage level and isolated from the negative voltage level;

an input stage coupled to said bias generator and operable to receive two input signals, said input stage comprising a balanced signal path to isolate noise found on said input signals;

a conversion circuit coupled to said balanced signal path for converting said input signals into a single differential signal; and an output stage coupled to said conversion circuit for processing said single differential signal into an output signal, said output stage comprising a P-N-P type transistor coupled to said output signal such that said output signal is operable to swing from substantially near the positive voltage level to substantially near the negative voltage level in response to a variation of said input signals and operable to drive highly capacitive loads.

9. The operational amplifier of claim 8 wherein said input stage comprises junction field effect transistors for receiving said input signals.

10. The operational amplifier of claim 9 wherein the operational amplifier comprises components isolated from the negative voltage level.

11. An integrated circuit device having a first input for receiving a first voltage level and a second input for receiving a neutral second voltage, comprising:

an operational amplifier; and a charge pump coupled to said operational amplifier and operable to generate a third voltage level in response to the first voltage level, said operational amplifier having a bias generator isolated from said third voltage level, said charge pump further comprising a current bias generator, a voltage bias generator coupled to said current bias generator, and oscillator coupled to said voltage bias generator for generating a square wave signal, and a plurality of power switches coupled to said oscillator, said square wave signal operable to drive said plurality of power switches into off and on state.

12. The device of claim 11 and further comprising two external capacitors coupled to said power switches and operable to charge and discharge to generate said third voltage level.

13. The device of claim 11 and further comprising a disable circuit coupled to said oscillator for temporarily disabling said oscillator.

14. The device of claim 11 and further comprising a current mirror isolating said oscillator from said power switches.

15. The device of claim 11 and further comprising a switch driver to control operation of said power switches.

16. The device of claim 11 wherein said first voltage level comprises a positive supply voltage.

17. The device of claim 11 wherein said first voltage level comprises a positive voltage level and said third voltage level comprises a negative voltage level, and said operational amplifier is operable to receive the positive voltage level, the neutral voltage level, and the negative voltage level, and comprises:

a bias generator coupled to the neutral voltage level for providing current bias;

an input stage coupled to said bias generator and operable to receive two input signals, said input stage comprising a balanced signal path to isolate noise found on said input signals;

a conversion circuit coupled to said balanced signal path for converting said input signals into a single differential signal; and an output stage coupled to said conversion circuit for processing said single differential signal into an output signal, said output signal operable to swing from substantially near the positive voltage level to substantially near the negative voltage level in response to a variation of said input signals.

18. The device of claim 17 wherein said output stage comprises a P-N-P type transistor to provide linearity and low distortion on said output signal.

19. The device of claim 17 wherein said bias generator is isolated from the negative voltage level.

20. The device of claim 17 wherein the operational amplifier comprises components isolated from the negative voltage level.

21. The device of claim 20 wherein the operational amplifier is formed on a substrate and further comprising transistor devices isolated from said substrate.

22. The device of claim 21 wherein said transistors are fabricated on a semiconductor tank within said substrate, said tank isolating said transistors from said substrate.

23. The device of claim 17 wherein said input stage comprises junction field effect transistors for receiving said input signals.

24. The device of claim 17 wherein said output signal is operable to drive highly capacitive loads.

* * * * *